United States Patent [19]
Edelstein et al.

[11] 4,443,760
[45] Apr. 17, 1984

[54] USE OF PHASE ALTERNATED RF PULSES TO ELIMINATE EFFECTS OF SPURIOUS FREE INDUCTION DECAY CAUSED BY IMPERFECT 180 DEGREE RF PULSES IN NMR IMAGING

[75] Inventors: William A. Edelstein, Schenectady; Paul A. Bottomley, Clifton Park, both of N.Y.

[73] Assignee: General Electric Company, Schenectady, N.Y.

[21] Appl. No.: 394,073

[22] Filed: Jul. 1, 1982

[51] Int. Cl.³ .............................................. G01R 33/08
[52] U.S. Cl. .................................. 324/309; 324/313; 324/314
[58] Field of Search ............... 324/300, 309, 307, 313, 324/314

[56] References Cited
U.S. PATENT DOCUMENTS

| | | | |
|---|---|---|---|
| 4,290,019 | 9/1981 | Hutchison | 324/309 |
| 4,339,716 | 7/1982 | Young | 324/309 |
| 4,384,255 | 5/1983 | Young | 324/309 |

OTHER PUBLICATIONS

"Phase and Intensity Anomalies in Fourier Transform NMR", Ray Freeman and H. D. W. Hill, Jr., Journal of Mag. Res., vol. 4, pp. 366–383.

*Primary Examiner*—Michael J. Tokar
*Attorney, Agent, or Firm*—Lawrence D. Cutter; James C. Davis, Jr.; Marvin Snyder

[57] ABSTRACT

The effects of a spurious free induction decay (FID) NMR signal due to imperfect 180° RF pulses are eliminated by phase alternating the selective 90° RF pulses and subtracting alternate ones of the NMR signals. The desired signals due to the 90° RF pulses reinforce, while the signals produced by the imperfect 180° pulses cancel. This method also has the beneficial effect of eliminating DC offset in the desired signal which, when present, causes artifacts in NMR images. Another method to eliminate the effects of spurious FID signals due to imperfect 180° pulses is to phase alternate these 180° pulses on successive NMR imaging pulse sequences and add successive NMR signals. In this case, the phase shifted spurious FID signals cancel, while the desired NMR signals reinforce. The latter method does not eliminate the effects of DC offset, however.

65 Claims, 16 Drawing Figures

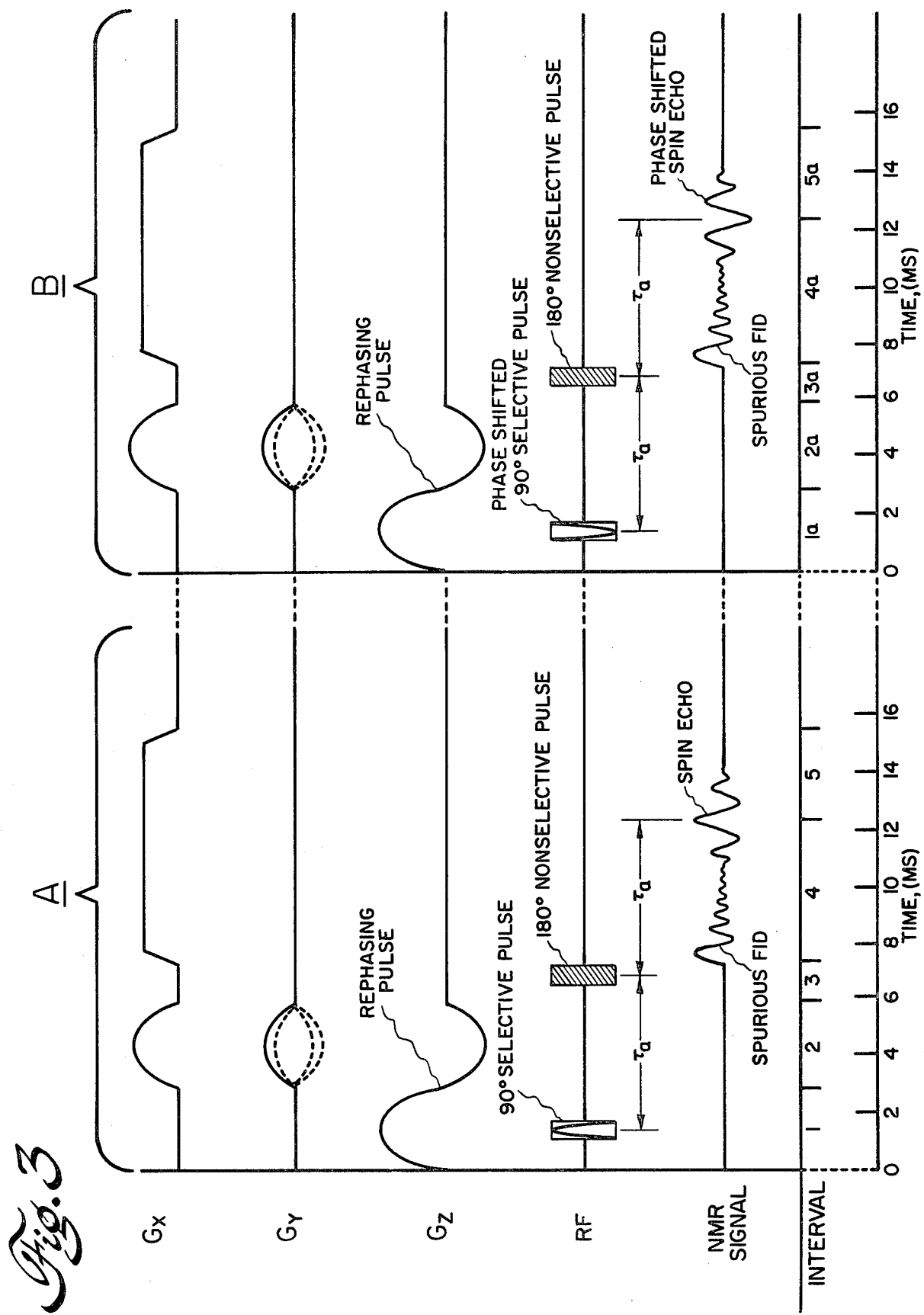

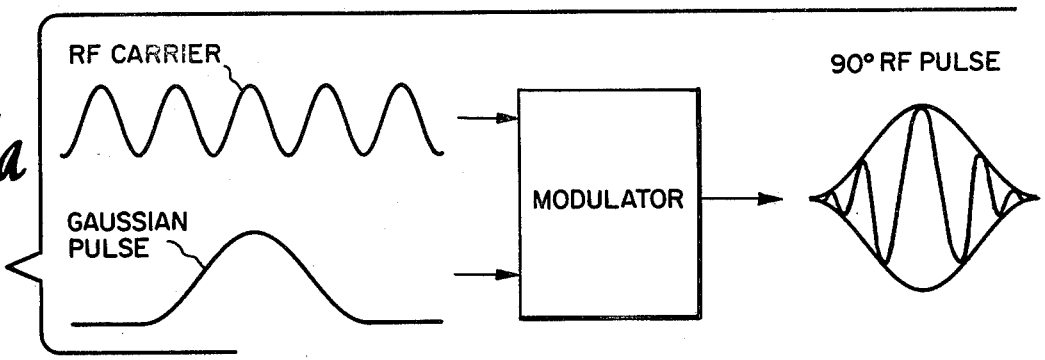
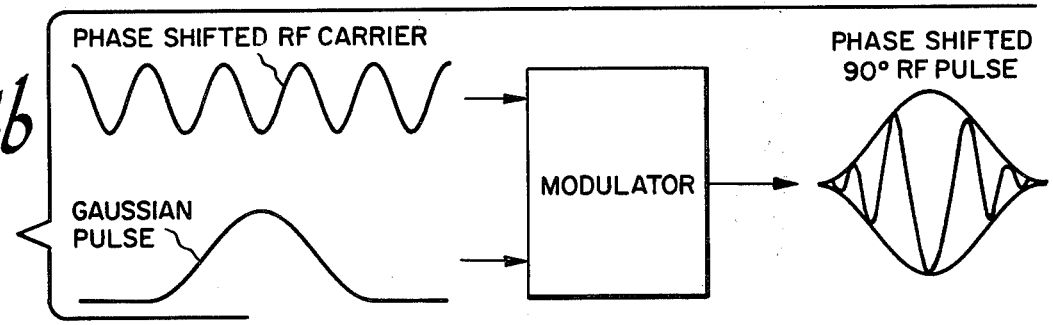
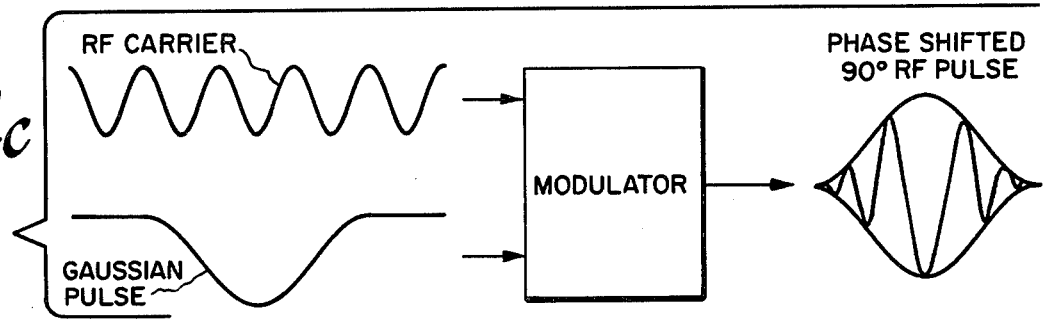
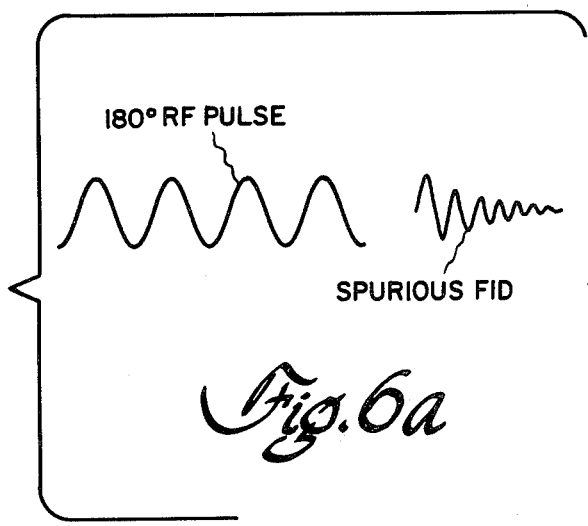
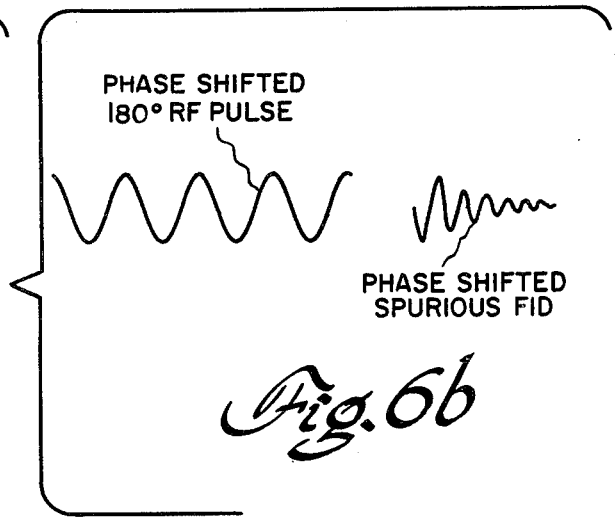

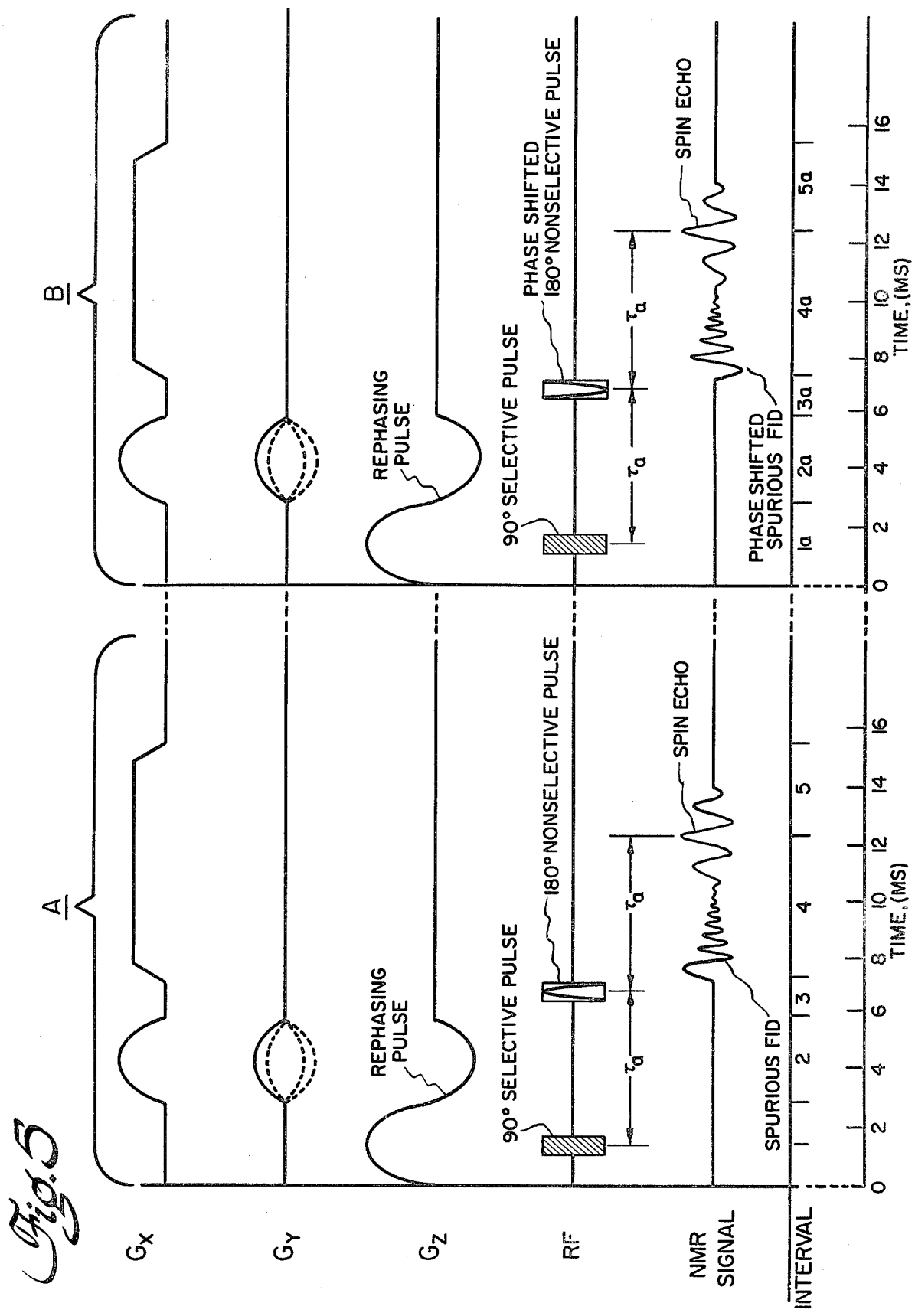

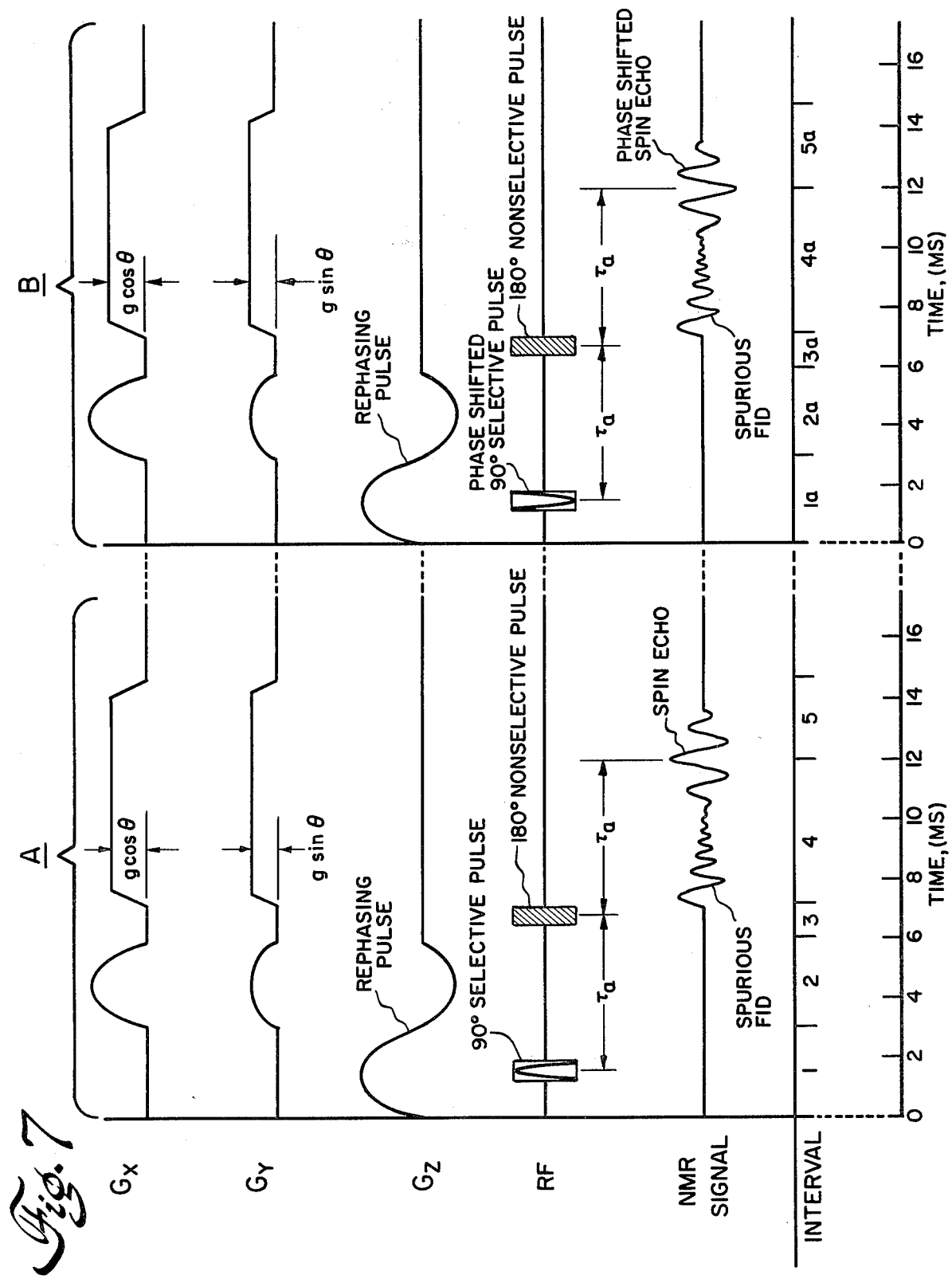

USE OF PHASE ALTERNATED RF PULSES TO ELIMINATE EFFECTS OF SPURIOUS FREE INDUCTION DECAY CAUSED BY IMPERFECT 180 DEGREE RF PULSES IN NMR IMAGING

BACKGROUND OF THE INVENTION

This invention relates to nuclear magnetic resonance (NMR) methods. More specifically, this invention relates to improved NMR imaging methods which eliminate the effects of spurious free induction decay (FID) NMR signals caused by imperfect 180° radio frequency (RF) pulses.

NMR imaging methods utilize a combination of pulsed magnetic field gradients and pulsed RF magnetic fields to obtain NMR imaging information from nuclear spins situated in a selected region of an imaging sample. The imaging sample is typically positioned in a static magnetic field $B_o$. The effect of field $B_o$ is to polarize nuclear spins having net magnetic moments so that a greater number of the spins align with the field and add to produce a net magnetization M. Individual polarized nuclear spins, and hence magnetization M, resonate (or precess about the axis of field $B_o$) at a frequency $\omega$ given by the equation $$\omega = \gamma B_o \tag{1}$$

in which $\gamma$ is the gyromagnetic ratio (constant for each NMR isotope).

As will be more fully described hereinafter, magnetic field gradients are necessary to encode spatial information into the NMR signal. If a magnetic field gradient along an imaging volume is a function of position, then so is the frequency $\omega$. In fact, if the imaging gradient is linear, the frequency spectrum is a one-dimensional projection of the NMR signal distribution along the direction of the gradient.

RF magnetic field pulses are directed orthogonal to the $B_o$ field used to excite nuclear spins to resonance. The frequency of the RF pulse needed to induce resonance is the same as the resonance frequency defined by equation (1). Two types of RF magnetic field pulses commonly used are 90° and 180° pulses. A 90° RF pulse causes magnetization M to rotate 90° about the axis defined by the applied RF magnetic field vector in a frame of reference rotating at the resonant frequency $\omega$ about the direction of field $B_o$, relative to the laboratory frame of reference. Thus, if the direction of field $B_o$ is assumed to be the positive Z-axis direction of a Cartesian coordinate system, a 90° RF pulse will cause magnetization M along $B_o$ to rotate into the transverse plane defined by the X- and Y-axis, for example. Similarly, a 180° RF pulse causes magnetization M along $B_o$ to rotate 180° about the axis of field $B_o$ (e.g., from the positive Z-axis direction to the negative Z-axis direction).

Nuclear spins rotated 90° into the transverse plane, or through some other angle such that magnetization M has a vectorial component in the transverse plane, will produce an FID NMR signal which is observable upon termination of RF excitation. The FID signal can be detected by a receiver coil positioned to be sensitive along the transverse plane.

An NMR FID signal will not be observed if the nuclear spins are inverted 180° from the direction of the static magnetic field $B_o$, because magnetization M under these conditions does not have a component in the plane of the receiver coil. While this is true for ideal 180° RF pulses, in practice the 180° pulses are rarely ideal, and in virtually all cases a small spurious FID occurs immediately following the 180° pulse. The FID can arise because the 180° RF pulse is not precisely 180°. If it were to be set at 160°, for example, then there could be spurious FID signals arising from previously unexcited spins which would simulate the application of a 20° RF pulse. In some cases, the RF transmitter coils used to irradiate the imaging sample generate inhomogeneous fields so that parts of the imaging sample do not receive precisely a 180° pulse and therefore contribute an FID component in the transverse plane. Some NMR techniques utilize selective 180° RF pulses to invert nuclear spins by 180° in a planar section of an imaging sample, while leaving those spins outside the section substantially unaffected. In this case, regions bordering the planar section of nuclear spins selectively inverted by a 180° RF pulse can actually experience a 90° RF pulse and thereby generate a large FID.

The effect of imperfections in 180° RF pulses on NMR images can be quite severe. If the spurious FID signal lasts sufficiently long it will add to the desired NMR signal that contains the spatial encoding information for imaging. Because the spurious FID signal has different spatial encoding, it generates artifacts in the reconstructed image. In the case of selective 180° pulses, the spurious signal can render the selective 180° RF pulses unusable.

The NMR pulse sequences in accordance with the present invention eliminate the effects of spurious FID NMR signals caused by imperfect 180° RF pulses. Either the 90° pulses or the 180° pulses may be phase alternated so that the spurious FID signals cancel when the desired signals are analyzed. Although the invention is described with reference to NMR imaging methods, its applicability is not limited thereto. The invention is applicable to other NMR methods in which spurious FID signals, caused by imperfect 180° RF pulses, produce undesirable effects. One such method is the use of selective 180° RF pulses in localized NMR spectroscopy. Another is the use of selective 180° RF pulses in localized blood flow measurement. The invention is also applicable to three-dimensional NMR imaging methods, such as those described and claimed in the commonly assigned application Ser. No. 365,229 filed Apr. 5, 1982 by the same inventors as herein and which is hereby incorporated by reference as background material.

SUMMARY OF THE INVENTION

The effects of spurious FID NMR signals caused by imperfect 180° RF pulses are overcome by phase alternating selective 90° RF pulses in consecutive NMR pulse sequences and subtracting alternate NMR signals. The desired NMR signals produced by the 90° RF pulses reinforce, while the spurious FID signals produced by the 180° RF pulses cancel.

Another method to eliminate the effects of spurious FID signals is to phase alternate the 180° RF pulses on successive NMR pulse sequences and add the successive NMR signals. In this case, the spurious FID signals are phase shifted and thereby cancel, while the desired NMR signals reinforce.

It is an object of the invention to provide improved NMR methods which eliminate the effects of spurious FID NMR signals produced by imperfect 180° RF pulses.

It is another object of the invention to provide improved NMR imaging pulse sequences for eliminating image artifacts due to spurious FID NMR signals caused by imperfect 180° RF pulses.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 3 illustrates two-dimensional Fourier transform NMR imaging sequences which help in understanding the use of the invention to eliminate the effects of spurious FID signals.

FIGS. 4a–4c depict phase alternated 90° RF pulses having a Gaussian envelope and which are useful in the present invention.

FIG. 5 depicts a pulse sequence similar to that of FIG. 3, but in which phase alternated 180° RF pulses are used to eliminate the effects of spurious FID signals.

FIGS. 6a–6b illustrate phase alternated 180° RF pulses which are useful with the present invention to eliminate the effects of spurious FID signals.

FIG. 7 depicts a pulse sequence which illustrates the application of the invention to a multiple angle projection reconstruction NMR imaging pulse sequence.

DETAILED DESCRIPTION OF THE INVENTION

Figure 1:
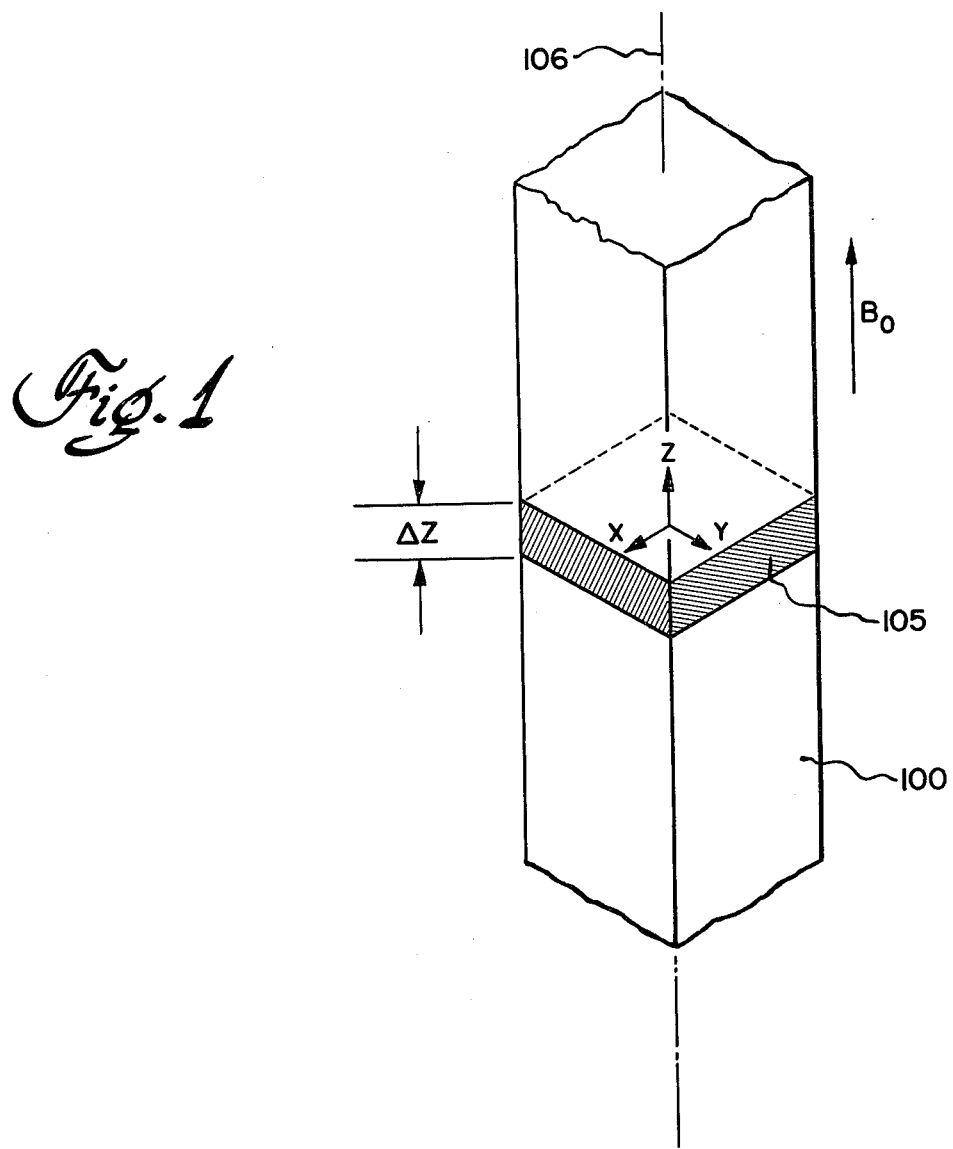
FIG. 1 illustrates an NMR imaging sample situated in a static magnetic field and having a planar imaging volume defined therein by selective excitation.

The NMR imaging pulse sequences produced by the invention will be best understood if initial reference is made to FIG. 1 which depicts an imaging sample 100 situated in a static homogeneous magnetic field $B_o$ directed in the positive Z-axis direction of the Cartesian coordinate system. The Z-axis is selected to be coincident with the long or cylindrical axis 106 of sample 100. The origin of the coordinate system is taken to be the center of the imaging sample, which is also at the center of a planar slice or imaging volume 105 selected by the selective excitation method as will be described hereinafter. A single planar image corresponding to section 105, for example, can be constructed using the spatial information obtained with the use of anyone of the pulse sequences depicted in FIGS. 3, 5, and 7. Each of these pulse sequences will be described hereinafter in greater detail. Typically, thickness Δz of a planar slice 105 is approximately 2 to 15 millimeters.

Figure 2:
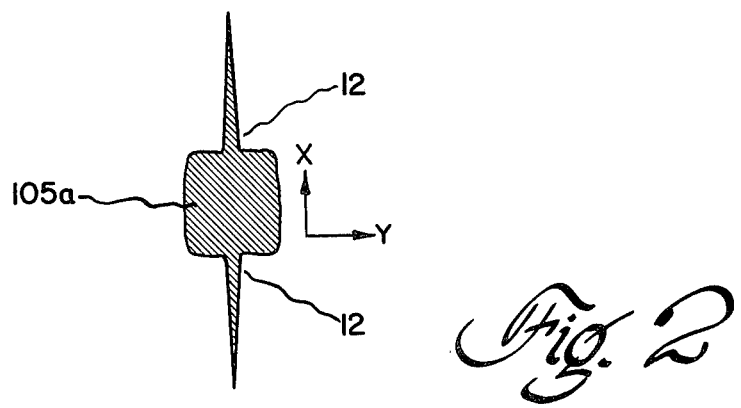
FIG. 2 depicts schematically an NMR image exhibiting streak artifacts occurring in two-dimensional Fourier transform imaging methods as a result of imperfect 180° RF pulses.

FIG. 2 depicts schematically an NMR section image 105a corresponding to section 105 in sample 100 (FIG. 1), in this case selected to be a water-filled bottle to simulate living tissue which typically is of high water content. Image 105a represents the distribution of protons (hydrogen nuclei) in slice 105 of the water filled bottle, and hence shows uniform proton distribution.

Image 105a, constructed from imaging information obtained by the use of the NMR pulse sequence shown at A in FIG. 3, exhibits streak artifacts 12 attributable to spurious FID NMR signals (occurring during interval 4, FIG. 3) caused by imperfect 180° RF pulses (occurring during interval 3, FIG. 3). The pulse sequence shown in FIG. 3 is an example of the two-dimensional Fourier transform imaging method. The artifact lies along line y=0 (FIG. 1) where y is the direction of the phase encoding gradient (to be more fully described hereinafter).

FIG. 7 illustrates a multiple angle projection reconstruction NMR imaging method. In this method, the image artifacts are caused by the projection of the spurious FID signals (arising outside the imaging volume) along with the desired NMR signal in the direction of the imaging gradient (described more fully hereinafter). In this case the spurious FID produces a degradation in the signal-to-noise ratio and concomitantly in reconstructed image quality.

In order to better appreciate the present invention, the pulse sequence A depicted in FIG. 3 will be described first. In this pulse sequence, as in others described herein, the imaging sample is positioned in a static magnetic field $B_o$, which is accordingly omitted from all of the figures depicting NMR pulse sequences. In addition, in each pulse sequence field gradients are necessary to produce spatial localization of the NMR signal. Typically, three such gradients are necessary:

$$G_x(t) = \partial B_o / \partial x \quad (2)$$

$$G_y(t) = \partial B_o / \partial y \quad (3)$$

$$G_z(t) = \partial B_o / \partial z \quad (4)$$

The $G_x$, $G_y$, and $G_z$ gradients are constant throughout the imaging volume 105, (FIG. 1), but their magnitudes are typically time dependent. The magnetic fields associated with the gradients are denoted, respectively, $b_x$, $b_y$, and $b_z$, wherein $$b_x = G_x(t)x \quad (5)$$

$$b_y = G_y(t)y \quad (6)$$

$$b_z = G_z(t)z \quad (7)$$

within the imaging volume.

Selection of planar section 105 (FIG. 1) of nuclear spins is accomplished during interval 1 shown on the horizontal axis of FIG. 3. In this interval, a positive magnetic field gradient $G_z$ is applied so that the imaging sample 100 is subjected to a total magnetic field in the Z-axis direction composed of the gradient $G_z$ and static magnetic field $B_o$. Approximately at the midpoint of interval 1, the sample is irradiated with a selective 90° RF pulse with a frequency content selected so as to preferentially excite nuclear spins in planar section 105

(FIG. 1) in which the magnetic field strength is as predicted by equation (1). Nuclear spins outside region 105 remain substantially unaffected by this Rf pulse. The "selective" nature of the 90° RF pulse is thus apparent.

At the end of interval 1, nuclear spins in planar section 105 have been rotated into the transverse plane, and although they precess at the same frequency, they are out of phase with one another due to the dephasing effect of $G_z$ during the second half of interval 1. The nuclear spins are rephased in interval 2 by the application of a negative $G_z$ gradient (rephasing pulse) related to the positive $G_z$ gradient in interval 1 such that $$\int_2 dt G_z = -\tfrac{1}{2} \int_1 dt G_z, \quad (8)$$

where $\int_2$ is the integral with respect to time of the waveform of gradient $G_z$ over interval 2, and $\int_1$ is the integral with respect to time of the waveform of gradient $G_z$ over interval 1.

Simultaneously with the application of the negative $G_z$ gradient in interval 2, a phase encoding $G_y$ gradient having one of $n_y$ different amplitudes (as indicated by the dashed lines) is applied. The $G_y$ gradient encodes spatial information in the Y-axis direction by introducing a twist in the orientation of the nuclear spins by an integral multiple of $2\pi$ over the total length of sample 100 in the Y-axis direction. Following the application of the first phase encoding gradient, the nuclear spins are twisted into a one-turn helix. Each different amplitude of gradient $G_y$ introduces a different degree of twist (phase encoding). The number $n_y$ of $G_y$ gradient amplitudes is chosen to be equal to the number of pixels the reconstructed image will have in the Y-axis direction. The pulse sequence of FIG. 3 is repeated for $n_y$ different amplitudes of gradient $G_y$ to produce $n_y$ NMR spin echo signals in intervals 4 and 5. In practice, the signals are averaged several times prior to advancing the $G_y$ gradient in order to improve the signal-to-noise ratio. Typically $n_y$ is 128 or 256.

Also in interval 2, a positive $G_x$ magnetic field gradient is applied to dephase nuclear spins in the X-axis direction by a predetermined amount. The 180° RF pulse applied in interval 3 reverses the direction of nuclear spin dephasing so that the nuclear spins again rephase and produce an NMR spin echo signal (intervals 4 and 5) which can be observed at a time when the imaging gradient $G_x$ is constant. In the absence of the dephasing gradient and the 180° RF pulse, the NMR signal would occur at sometime near the end of interval 2 and the beginning of interval 3. It would be difficult to obtain useful spatial information from such an NMR signal because there would be a finite time period when imaging gradient $G_x$ is transient and its exact strength unknown. The resulting spatial information would be badly distorted and could not be normally used.

If the 180° RF pulse in interval 3 is applied (following a short time interval of between 0.1 and 1 millisecond to allow current in the gradient winding to subside) at a time $\tau_a$ following the application of the selective 90° RF pulse, (wherein $\tau_a$ is the time period between the mean application of the 90° and 180° RF pulses, typically about 5 milliseconds), and the $G_x$ gradient in intervals 2 and 4 is selected such that $$\int_2 G_x dt = \int_4 G_x dt, \quad (9)$$

where $\int_2$ is the time integral of the waveform of gradient $G_x$ over interval 2, and $\int_4$ is the time integral of the waveform of gradient $G_x$ over interval 4, then the spin echo signal is the resultant of two spin echo signal components. The first of the two signal components is due to the rephasing of the nuclear spins dephased by inherent inhomogeneities in the static magnetic field $B_o$. The spins rephase and produce a spin-echo signal at a period $\tau_a$ following the application of the 180° RF pulse. The second spin echo signal component is due to the reversal of the nuclear spins dephased in interval 2 (by gradient $G_x$) which also rephase and produce a spin echo signal at time interval $\tau_a$ after the application of the 180° RF pulse, provided the condition of equation (9) is satisfied. The method for overcoming the effects of the inhomogeneities in the static field $B_o$ is described and claimed in application Ser. No. 345,444, filed Feb. 3, 1982 by the same inventors as herein and assigned to the same assignee as the present invention. This patent application is incorporated herein by reference.

Although magnetic field gradient $G_x$ is depicted in interval 2 as the positive half of a sinusoid, it can be of any shape, provided equation (9) is satisfied. For example, gradient $G_x$ could also have a Gaussian or rectangular configuration.

To introduce spatial discrimination in the X-axis direction, the nuclear spin echo in intervals 4 and 5 is sampled (in quadrature) $n_x$ times during this time interval in the presence of the imaging $G_x$ gradient, where $n_x$ is typically equal to $n_y$, and is equal to the number of pixels the image has in the x-axis direction. Upon analysis by known discrete, two-dimensional Fourier transform methods, imaging section 105 is divided into $n_x \cdot n_y$ pixels, which can be used to construct an image such as image 105a in FIG. 1.

An exemplary time scale is shown parallel to the horizontal axis in FIG. 3.

It is to be noted that the NMR spin echo signal in intervals 4 and 5 also contains a contribution due to a spurious FID signal caused by the imperfect nature 180° RF pulse applied in interval 3. The spurious FID signal occurs immediately following application of the 180° RF pulse in interval 3, and may extend (as shown) into intervals 4 and 5 during which the spin echo signal is sampled. The spurious FID signal accounts for streak artifacts 12 shown in FIG. 2.

The effects of the spurious FID signals can be eliminated if in successive applications of the pulse sequence, (as at B, FIG. 3), the phase of the 90° RF pulses is shifted by 180°. As a consequence, the spin echo signals due to the 90° pulses will also be phase shifted (as shown), while the spurious FID signals in intervals 4-5 and 4a-5a (due to the 180° pulses) will be unaffected. In this manner, if the resulting spin echo signals produced by alternate 90° RF pulses were subtracted, they would reinforce. Any spurious FID signal from the 180° RF pulse would remain unchanged in successive sequences and when subtracted would cancel. This subtraction has the additional benefit of eliminating any DC offset in the desired spin echo signal. The DC offset is a low voltage (on the order of microvolts) which is superimposed on the NMR spin echo signal by the system electronics and causes additional image artifacts.

The method by which the phase of the 90° RF pulse may be shifted, may be best understood by reference to FIGS. 4a-4c. FIG. 4a shows an RF carrier and Gaussian shaped pulse applied to a conventional amplitude modulator. The rresulting 90° RF pulse has an envelope having a Gaussian configuration. FIG. 4b is similar to FIG. 4a except that the RF carrier is 180° out of phase with respect to the carrier in FIG. 4a. Consequently, the respective 90° RF pulses are similarly out of phase with respect to one another. Thus, if the 90° RF pulse of FIG. 4a is applied in interval 1 of FIG. 3, and if the 90° RF pulse shown in FIG. 4b is applied in the successive pulse sequence in interval 1a, the resulting spin echo signals would also be out of phase. The spurious FID caused by the 180° RF pulses applied in intervals 3 and 3a remain unaffected. In this manner, if alternate spin echo signals are subtracted they will reinforce, while the spurious FID will cancel. Similarly, since the DC offset remains unaffected by the phase alternation, it will cancel.

FIG. 4c illustrates an alternative technique for producing a phase alternated 90°RF pulse. In this case, the phase of the RF carrier shown in FIG. 4a is held constant, while the polarity of the Gaussian pulse is reversed. Thus, the 90° pulse of FIG. 4a is 180° out of phase with respect to the pulse depicted in FIG. 4c.

In another method for eliminating the effects of the spurious FID signals, the phase of the spurious signals in successive intervals 4–5 and 4a–5a of FIG. 5 may be alternated by phase shifting the 180° RF pulses applied in intervals 3 and 3a. Thus, if the 180° RF pulse shown in FIG. 6a is applied in interval 3, and if in the successive pulse sequence the 180° RF pulse is phase shifted by 180° as shown in FIG. 6b, the resulting FID signals will be 180° out of phase with one another. Hence, when successive spin echo signals are added, they reinforce, while the FID signals cancel. The 180° RF pulses depicted in FIGS. 6a and 6b may be selective or nonselective. It should be noted that in this case the DC offset does not cancel and must be eliminated by other means. Except for the phase alternated 180° RF pulses in intervals 3 and 3a, and the phase inverted FID signals, FIG. 5 is identical to FIG. 3.

Although the 90° RF pulses have been described as being amplitude modulated by Gaussian shaped pulses, other frequency selective pulses may be used. For example, the RF carrier may be amplitude modulated by a signal of waveform (sin bt)/bt, in which t is time and b is a constant, so that the profile of section 105 (FIG. 1) is rectangular. With a Gaussian modulated RF pulse, section 105 has a Gaussian profile.

FIG. 7 depicts an NMR imaging pulse sequence used to obtain the imaging data by multiple angle projection reconstruction. In this pulse sequence, the manner in which the effect of the spurious FID NMR signal is eliminated is similar to that of FIGS. 3 or 5. Thus, either the 90° RF pulses are phase shifted and alternate spin echo signals subtracted, or the 180° RF pulses are phase alternated and the spin echo signals added, as described hereinbefore.

In the pulse sequence of FIG. 7, the respective integrals with respect to time of the waveforms of the $G_x$ and $G_y$ gradients are selected such that $$\int_2 G_x dt = \int_4 G_x dt, \quad (12)$$

$$\int_2 G_y dt = \int_4 G_y dt. \quad (13)$$

This ensures that the nuclear spins rephase at a time interval $\tau_a$ following the mean application of the 180° RF pulse in interval 3. In this manner, the effects of the inherent inhomogeneities in the static magnetic field on the spin echo in interval 5 are overcome substantially as described earlier with reference to FIG. 3. A similar relationship exists between the $G_x$ and $G_y$ gradients in intervals 2a and 4a.

Imaging information using the pulse sequence of FIG. 7 is obtained by observing the spin echo signal in intervals 4–5 and 4a–5a in the presence of imaging gradients $G_x$ and $G_y$ directed in the X- and Y-axis directions, respectively. The magnitudes of the $G_x$ and $G_y$ gradients are constant in intervals 4–5 and 4a–5a for each value of $\theta$, which is the angle of a single projection. However, as the projection angle is changed, the new gradient magnitudes are given by $G_x = g \cos \theta$ and $G_y = g \sin \theta$, respectively, in which $\theta$ is the angle of a single projection during intervals 4–5 or 4a–5a, and g is a constant. The spin-echo signal is observed in the presence of a magnetic field gradient which is the sum of $G_x$ and $G_y$ gradient fields. The $G_x$ and $G_y$ field gradients add vectorially to produce a resultant radial gradient in the imaging plane at angle $\theta$. Spatial information from the entire plane is encoded in the direction of the radial gradient. In order to obtain sufficient information to image the entire planar section 105, multiple projections are obtained by changing projection angle $\theta$ at, for example, 1° intervals to collect spatial data from at least 180 projections in a 180° arc. Fourier transformation of the signal corresponding to each projection provides the spatial distribution of the NMR signal in that direction. The image is reconstructed from all of the projections using known computer reconstruction algorithms such as those used to reconstruct computeized tomography images.

Figure 8:
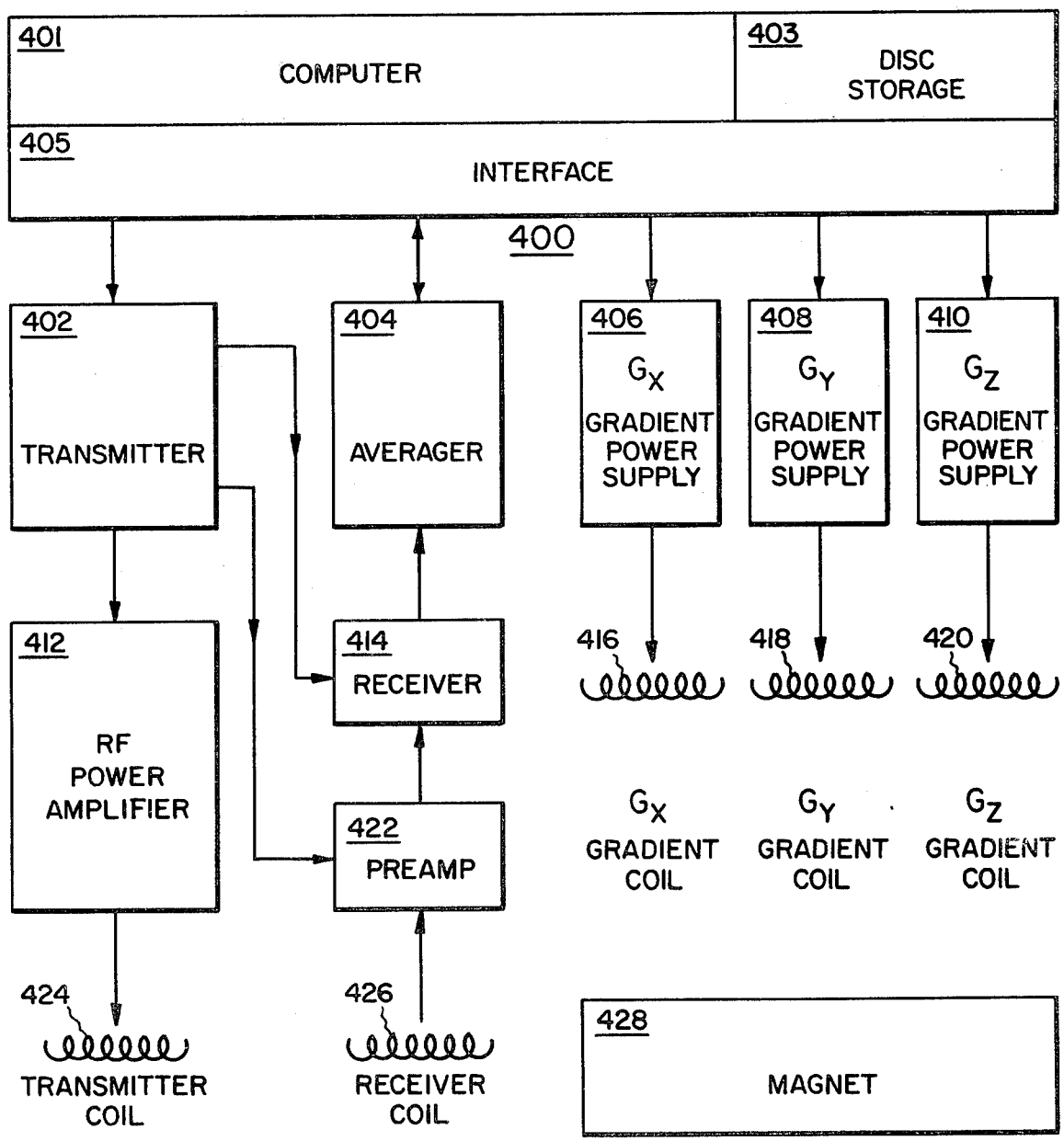
FIG. 8 illustrates a simplified block diagram of the major components of an NMR imaging apparatus suitable for producing the NMR pulse sequences shown in FIGS. 3, 5, and 7.

FIG. 8 is a simplified block diagram of the major components of an NMR imaging system suitable for use with the NMR pulse sequences of the invention described herein. The system, generally designated 400, is made up of a general purpose mini-computer 401 which is functionally coupled to disk storage unit 403 and an interface unit 405. An RF transmitter 402, signal averager 404, and gradient power supplies 406, 408, and 410 for energizing, respectively, x, y, z gradient coils 416, 418, and 420, are coupled to computer 401 through interface unit 405.

RF transmitter 402 is gated with pulse envelopes from computer 401 to generate RF pulses having the required modulation to excite resonance in the object under study. The RF pulses are amplified in RF power amplifier 412 to levels varying from 100 watts to several kilowatts, depending on the imaging method, and applied to transmitter coil 424. The higher power levels are necessary for large sample volumes such as in whole body imaging, and where short duration pulses are required to excite large NMR frequency bandwidths.

The NMR signal is sensed by receive coil 426, amplified in a low noise preamplifier 422, and applied for further amplification, direction, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for the NMR pulses, blanking for the preamplifier and RF power amplifier, and voltage waveforms for the gradient power supplies. The computer also performs data processing such as Fourier transforms, image reconstruction, data filtering, imaging display, and storage functions (all of which are operations conventionally performed by minicomputers and hence described only functionally, supra).

Figure 9A:
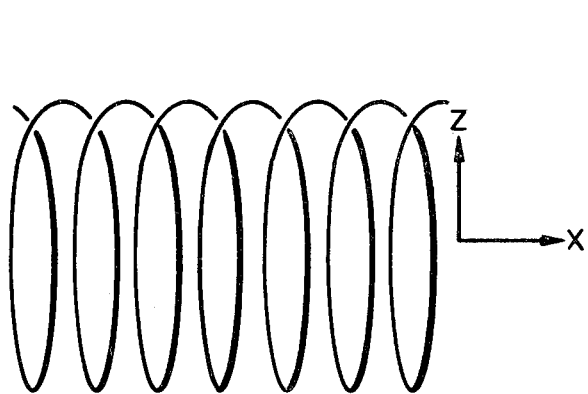
FIG. 9a illustrates an RF coil design for use with geometries for which the sample chamber is perpendicular to the static magnetic field.
Figure 9B:
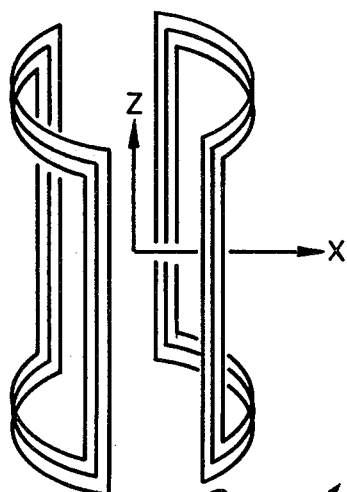
FIGS. 9b and 9c illustrate an RF coil design suitable for magnetic geometries for which the axis of the sample chamber is parallel to the static magnetic field.
Figure 9C:
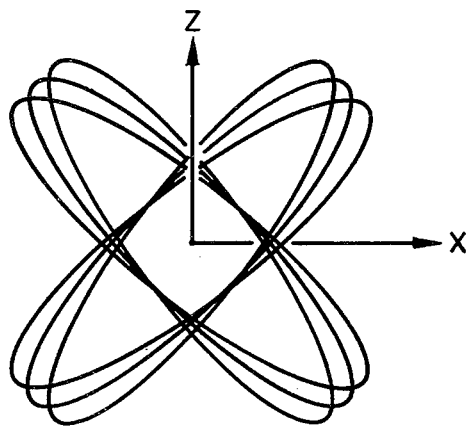

The transmitter and receiver RF coils, if desired, may comprise a single coil. Altenatively, two separate coils that are electrically orthogonal may be used. The latter configuration has the advantage of reduced RF pulse breakthrough into the receiver during pulse transmission. In both cases, the fields of coils are orthogonal to the direction of the static magnetic field $B_o$ produced by magnet 428 (FIG. 8). The coils are isolated from the remainder of the system by enclosure in an RF shielded cage. Three typical RF coil designs are illustrated in FIGS. 9a, 9b, and 9c. All of these coils produce RF magnetic fields in the x direction. The coil designs illustrated in FIGS. 9b and 9c are suitable for magnetic geometries for which the axis of the sample chamber is parallel to the main field $B_o$ (FIG. 1). The design illustrated in FIG. 9a is applicable to geometries for which the sample chamber axis is perpendicular to the main field $B_o$ (not shown).

Magnetic field gradient coils 416, 418, and 420 (FIG. 8) are necessary to provide gradients $G_x$, $G_y$, and $G_z$, respectively. In the imaging pulse sequences described herein, the gradients should be monotonic and linear over the sample volume. Non-monotonic gradient fields cause a degradation in the NMR signal data, known as aliasing, which leads to servere image artifacts. Nonlinear gradients cause geometric distortions of the image.

Figure 10A:
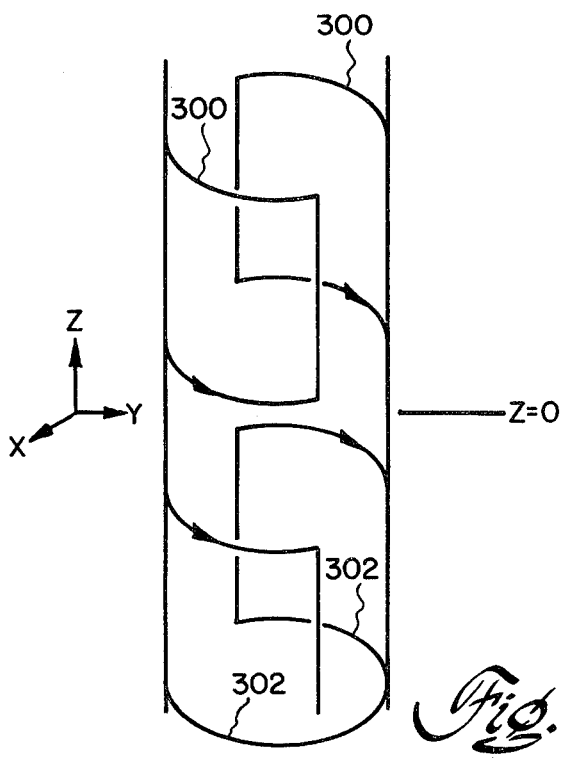
FIG. 10a illustrates two sets of coils suitable for producing $G_x$ and $G_y$ gradients.
Figure 10B:
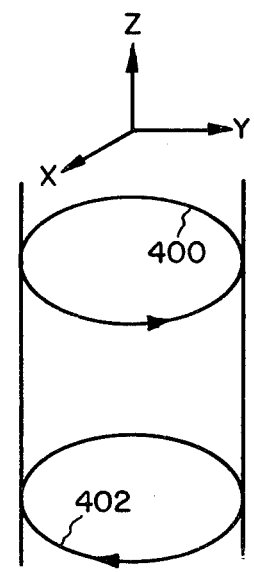
FIG. 10b depicts a coil configuration suitable for producing a $G_z$ gradient.

A design for gradient coils suitable for magnet geometries with a sample chamber axis parallel to the main field $B_o$ is depicted in FIGS. 10a and 10b. Each of gradients $G_x$ and $G_y$ is produced by a set of coils such as sets 300 and 302 depicted in FIG. 10a. The coil sets as illustrated in FIG. 10a produce gradient $G_x$. The coil sets for producing gradient $G_y$ are rotated 90° around the cylindrical axis 106 (FIG. 1) of the sample chamber relative to the coil that produces gradient $G_x$. The z gradient is generated by a coil pair such as coils 400 and 402 shown in FIG. 10b.

From the foregoing, it will be apparent that the NMR pulse sequences in accordance with the invention provide improved NMR methods which eliminate the effects of spurious FID signals produced by imperfect 180° RF pulses. Application of the invention to NMR imaging results in improved NMR pulse sequences which eliminate image artifacts due to the spurious FID signals.

While this invention has been and described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for overcoming the effects of a spurious FID NMR signal so as to avoid interference thereof with the desired NMR spin echo signal, said method comprising sequentially the steps of:
   a. maintaining a static magnetic field along a first axis of an NMR imaging sample;
   b. selectively exciting, during a first predetermined time interval, a first plurality of nuclear spins in a planer section of said imaging sample by irradiating said imaging sample with a selective RF pulse in the presence of a first magnetic field gradient pulse;
   c. applying for a second predetermined time interval at least one dephasing magnetic field gradient pulse along a second axis of said imaging sample to dephase said excited nuclear spins;
   d. irradiating said imaging sample during a third time interval with a 180° RF pulse so as to initiate the rephasing of said excited nuclear spins, whereupon inherent imperfections in said 180° RF pulse cause a second plurality of nuclear spins in said imaging sample to change orientation by an angle other than 180° relative to the direction of said static magnetic field, said last-mentioned nuclear spins producing a net nuclear magnetization component transverse to the direction of said static magnetic field, which component produces a spurious FID NMR signal upon termination of said 180° RF pulse;
   e. applying during a fourth predetermined time interval at least one imaging gradient having the same direction as said dephasing gradient such that a nuclear spin echo signal is produced by said rephasing of said excited nuclear spins;
   f. sampling said spin echo in the presence of said imaging gradient; and
   g. repeating steps (b-f) while shifting the phase of alternate ones of the selective RF pulses by 180° so as to produce a 180° shift in the corresponding spin echo signals such that, when alternate ones of said spin echo signals are subtracted, said spin echo signals reinforce while said spurious FID signals cancel.

2. The method of claim 1 wherein said selective RF pulse comprises a 90° RF pulse.

3. The method of claim 1 wherein said frequency selective pulse comprises a carrier modulated by a signal defined by $(\sin bt)/bt$, wherein b is a constant and t is time.

4. The method of claim 1 wherein said 90° RF pulse comprises a Gaussian amplitude modulated carrier.

5. The method of claim 1 wherein said planar section is situated orthogonal to said first axis of said sample.

6. The method of claim 1 wherein said dephasing gradient in step (c) comprises a resultant dephasing gradient of the vectorial addition of two constituent dephasing gradients which are mutually orthogonal and which are coplanar with said planar section, said resultant dephasing gradient having a predetermined direction.

7. The method of claim 6 wherein said imaging gradient in step (e) is a resultant rephasing gradient of the vectorial addition of two constituent rephasing gradients which are mutually orthogonal and which are coplanar with said planar section, said constituent rephasing gradients having the same respective directions within said thin planar slab as said constituent dephasing gradients, said constituent rephasing gradients being selected such that said resultant rephasing gradient has the same predetermined direction as said resultant dephasing gradient.

8. The method of claim 7 wherein said resultant rephasing gradient is selected to exhibit a constant amplitude during the step of sampling said composite NMR spin echo signal.

9. The method of claim 8 further comprising the step of repeating the sequence of steps (a-f) for different directions of said resultant dephasing and rephasing gradients so as to cover, incrementally, at least a 180° arc within said thin planar slab.

10. The method of claim 1 wherein said dephasing gradient in step (c) comprises the resultant of the vectorial addition of first and second mutually orthogonal gradients which are coplanar with said planar slice, said first orthogonal gradient being amplitude-adjustable for phase encoding nuclear spin information in the direction thereof.

11. The method of claim 10 wherein said imaging gradient is selected to have the same direction as said second orthogonal gradient.

12. The method of claim 10 wherein said imaging gradient in step (e) is selected to have a constant amplitude during the step of sampling said NMR spin echo signal.

13. The method of claim 12 further comprising the step of repeating the sequence of steps (a–g) for a different amplitude of said first orthogonal gradient.

14. method for overcoming the effects of a spurious FID NMR signal so as to avoid interference thereof with the desired NMR spin echo signal, said method comprising sequentially the steps of:
   a. maintaining a static magnetic field along a first axis of an NMR imaging sample;
   b. selectively exciting, during a first predetermined time interval, a first plurality of nuclear spins in a planar section of said imaging sample by irradiating said imaging sample with a selective RF pulse in the presence of a first magnetic field gradient pulse;
   c. applying for a second predetermined time interval at least one dephasing magnetic field gradient pulse along a second axis of said imaging sample to dephase said excited nuclear spins;
   d. irradiating said imaging sample during a third time interval with a 180° RF pulse so as to initiate the rephasing of said excited nuclear spins, whereupon inherent imperfections in said 180° RF pulse cause a second plurality of nuclear spins in said imaging sample to change orientation by an angle other than 180° relative to the direction of said static magnetic field, said last-mentioned nuclear spins producing a net nuclear magnetization component transverse to the direction of said static magnetic field, which component produces a spurious FID NMR signal upon termination of said 180° RF pulse;
   e. applying during a fourth predetermined time interval at least one imaging gradient having the same direction as said dephasing gradient such that a nuclear spin echo signal is produced by said rephasing of said excited nuclear spins;
   f. sampling said spin echo signal in the presence of said imaging gradient; and
   g. repeating steps (a–f) while shifting the phase of alternate ones of the 180° RF pulses by 180° so as to produce a 180° shift in the corresponding spurious FID signals such that, when successive spin echo signals are added said spin echo signals reinforce while said spurious FID signals cancel.

15. The method of claim 14 wherein said selective RF pulse comprises a 90° RF pulse.

16. The method of claim 14 wherein said frequency selective pulse comprises a carrier modulated by a signal defined by (sin bt)/bt, wherein b is a constant and t is time.

17. The method of claim 14 wherein said 90° RF pulse comprises a Gaussian amplitude modulated carrier.

18. The method of claim 14 wherein said planar section is situated orthogonal to said first axis of said sample.

19. The method of claim 14 wherein said dephasing gradient in step (c) comprises a resultant dephasing gradient of the vectorial addition of two constituent dephasing gradients which are mutually orthogonal and which are coplanar with said planar section, said resultant dephasing gradient having a predetermined direction.

20. The method of claim 19 wherein said imaging gradient in step (e) is a resultant rephasing gradient of the vectorial addition of two constituent rephasing gradients which are mutually orthogonal and which are coplanar with said planar section, said constituent rephasing gradients having the same respective directions within said thin planar slab as said constituent dephasing gradients, said constituent rephasing gradients being selected such that said resultant rephasing gradient has the same predetermined direction as said resultant dephasing gradient.

21. The method of claim 20 wherein said resultant rephasing gradient is selected to exhibit a constant amplitude during the step of sampling said composite NMR spin echo signal.

22. The method of claim 21 further comprising the step of repeating the sequence of steps (a–f) for different directions of said resultant dephasing and rephasing gradients so as to cover, incrementally, at least a 180° arc within said thin planar slab.

23. The method of claim 14 wherein said dephasing gradient in step (c) comprises the resultant of the vectorial addition of first and second mutually orthogonal gradients which are coplanar with said planar slice, said first orthogonal gradient being amplitude-adjustable for phase encoding nuclear spin information in the direction thereof.

24. The method of claim 23 wherein said imaging gradient is selected to have the same direction as said second orthogonal gradient.

25. The method of claim 23 wherein said imaging gradient in step (e) is selected to have a constant amplitude during the step of sampling said NMR spin echo signal.

26. The method of claim 25 further comprising the step of repeating the sequence of steps (a–g) for a different amplitude of said first orthogonal gradient.

27. A method which overcomes the effects of inherent static magnetic field inhomogeneity on NMR spin echo formation and which overcomes the effects of a spurious FID NMR signal so as to avoid interference thereof with the desired NMR spin echo signal, said method comprising sequentially the steps of:
   a. maintaining a static magnetic field along a first axis of an NMR imaging sample;
   b. selectively exciting, during a first predetermined time interval, a first plurality of nuclear spins in a planar section of said imaging sample by irradiating said imaging sample with a selective RF pulse in the presence of a first magnetic field gradient pulse;
   c. applying for a second predetermined time interval a dephasing magnetic field gradient pulse along a second axis of said imaging sample to dephase said excited nuclear spins, said dephasing being in addition to nuclear spin dephasing induced by inherent inhomogeneities in said static magnetic field;
   d. irradiating said imaging sample with a 180° RF pulse during a third time interval at a time period $\tau_d$ subsequent to the mean occurrence of said selective RF pulse, so as to initiate the rephasing of said excited nuclear spins, and whereupon inherent imperfections in said 180° RF pulse cause a second plurality of nuclear spins in said imaging sample to change orientation by an angle other than 180° relative to the direction of said static magnetic field, said last-mentioned nuclear spins producing a net nuclear magnetization component transverse to the direction of said static magnetic field, which component produces a spurious FID NMR signal upon termination of said 180° RF pulse;

e. applying during a fourth predetermined time interval, at least one imaging gradient having the same direction as said dephasing gradient in step c such that, at a period of time equal to said period $\tau_a$ following said 180° RF pulse, the nuclear spin echo caused by rephasing of the nuclear spins dephased by said last-mentioned dephasing gradient coincides with the occurrence of the nuclear spin echo derived from the rephasing of the nuclear spins dephased by the inherent inhomogeneities in said static magnetic field, said nuclear spin echoes producing a composite NMR spin echo signal;

f. sampling said composite NMR spin echo signal in the presence of said imaging gradient;

g. repeating steps (b–f) while shifting the phase of alternate ones of said selective RF pulses by 180° so as to produce a 180° shift in the corresponding spin echo signals such that when alternate ones of said spin echo signals are substracted said spin echo signals reinforce, while said spurious FID signals cancel.

28. The method of claim 27 wherein said selective RF pulse comprises a 90° RF pulse.

29. The method of claim 27 wherein said frequency selective pulse comprises a carrier modulated by a signal defined by (sin bt)/bt, wherein b is a constant and t is time.

30. The method of claim 27 wherein said 90° RF pulse comprises a Gaussian amplitude modulated carrier.

31. The method of claim 27 wherein said planar section is situated orthogonal to said first axis of said sample.

32. The method of claim 27 wherein said dephasing gradient in step (c) comprises a resultant dephasing gradient of the vectorial addition of two constituent dephasing gradients which are mutually orthogonal and which are coplanar with said planar section, said resultant dephasing gradient having a predetermined direction.

33. The method of claim 32 wherein said imaging gradient in step (e) comprises a resultant rephasing gradient of the vectorial addition of two constituent rephasing gradients which are mutually orthogonal and which are coplanar with said planar section, said constituent rephasing gradients having the same respective directions within said thin planar slab as said consitituent dephasing gradients, said constituent rephasing gradients being selected such that said resultant rephasing gradient has the same predetermined direction as said resultant dephasing gradient.

34. The method of claim 33 wherein the integral of the waveform of said resultant dephasing gradient with respect to time over said first time interval is selected to be equal to the integral of the waveform of said resultant imaging gradient with respect to time over a time interval equal to said time period $\tau_a$.

35. The method of claim 33 wherein said resultant rephasing gradient is selected to exhibit a constant amplitude during the step of sampling said composite NMR spin echo signal.

36. The method of claim 35 further comprising the step of repeating the sequence of steps (a–f) for different directions of said resultant dephasing and rephasing gradients so as to cover, incrementally, at least a 180° arc within said thin planar slab.

37. The method of claim 27 wherein said dephasing gradient in step (c) comprises the resultant of the vectorial addition of first and second mutually orthogonal gradients which are coplanar with said planar slice, said first orthogonal gradient being amplitude-adjustable for phase encoding nuclear spin information in the direction thereof.

38. The method of claim 37 wherein said imaging gradient is selected to have the same direction as said second orthogonal gradient.

39. The method of claim 37 wherein the integral of the waveform of said second orthogonal gradient with respect to time is selected to be equal to the integral of the waveform of said rephasing gradient in step (f) with respect to time over a time interval equal to said time period $\tau_a$.

40. The method of claim 27 wherein said imaging gradient in step (e) is selected to have a constant amplitude during the step of sampling said NMR spin echo signal.

41. The method of claim 40 further comprising the step of repeating the sequence of steps (a–g) for a different amplitude of said first orthogonal gradient.

42. A method which overcomes the effects of inherent static magnetic field inhomogeneity on NMR spin echo formation and which overcomes the effects of a spurious FID NMR signal so as to avoid interference thereof with the desired NMR spin echo signal, said method comprising sequentially the steps of:

a. maintaining a static magnetic field along a first axis of an NMR sample;

b. selectively exciting, during a first predetermined time interval, a first plurality of nuclear spins in a planar section of said imaging sample by irradiating said imaging sample with a selective RF pulse in the presence of a first magnetic field gradient pulse;

c. applying for a second predetermined time interval a dephasing magnetic field gradient pulse along a second axis of said imaging sample to dephase said excited nuclear spins, said dephasing being in addition to nuclear spin dephasing induced by inherent inhomogeneities in said static magnetic field;

d. irradiating said imaging sample with a 180° RF pulse during a third time interval at a time period $\tau_a$ subsequent to the mean occurrence of said selective RF pulse, so as to initiate the rephasing of said excited nuclear spins, and whereupon inherent imperfections in said 180° RF pulse cause a second plurality of nuclear spins in said imaging sample to change orientation by an angle other than 180° relative to the direction of said static magnetic field, said last-mentioned nuclear spins producing a net nuclear magnetization component transverse to the direction of said static magnetic field, which component produces a spurious FID NMR signal upon termination of said 180° RF pulse;

e. applying during a fourth predetermined time interval, at least one imaging gradient having the same direction as said dephasing gradient in step c such that, at a period of time equal to said period $\tau_a$ following said 180° RF pulse, the nuclear spin echo caused by rephasing of the nuclear spins dephased by said last-mentioned dephasing gradient coincides with the occurrence of the nuclear spin echo derived from the rephasing of the nuclear spins dephased by the inherent inhomogeneities in said static magnetic field, said nuclear spin echoes producing a composite NMR spin echo signal;

f. sampling said composite NMR spin echo signal in the presence of said imaging gradient;

g. repeating steps (a–f) while shifting the phase of alternate ones of the 180° RF pulses by 180° so as to produce a 180° shift in the corresponding spin echo signals such that, when alternate ones of said spin echo signals are added, said spin echo signals reinforce while said spurious FID signals cancel.

43. The method of claim 42 wherein said selective RF pulse comprises a 90° RF pulse.

44. The method of claim 42 wherein said frequency selective pulse comprises a carrier modulated by signal defined by (sin bt)/bt, wherein b is a constant and t is time.

45. The method of claim 42 wherein said 90° RF pulse comprises a Gaussian amplitude modulated carrier.

46. The method of claim 42 wherein said planar section is situated orthogonal to said first axis of said sample.

47. The method of claim 42 wherein said dephasing gradient in step (c) comprises a resultant dephasing gradient of the vectorial addition of two constituent dephasing gradients which are mutually orthogonal and which are coplanar with said planar section, said resultant dephasing gradient having a predetermined direction.

48. The method of claim 47 wherein said imaging gradient in step (e) comprises a resultant rephasing gradient of the vectorial addition of two constituent rephasing gradients which are mutually orthogonal and which are coplanar with said planar section, said constituent rephasing gradients having the same respective directions within said thin planar slab as said constituent dephasing gradients, said constituent rephasing gradients being selected such that said resultant rephasing gradient has the same predetermined direction as said resultant dephasing gradient.

49. The method of claim 48 wherein the integral of the waveform of said resultant dephasing gradient with respect to time over said first time interval is selected to be equal to the integral of the waveform of said resultant imaging gradient with respect to time over a time interval equal to said time period $\tau_a$.

50. The method of claim 48 wherein said resultant rephasing gradient is selected to exhibit a constant amplitude during the step of sampling said composite NMR spin echo signal.

51. The method of claim 50 further comprising the step of repeating the sequence of steps (a–f) for different directions of said resultant dephasing and rephasing gradients so as to cover, incrementally, at least a 180° arc within said thin planar slab.

52. The method of claim 42 wherein said dephasing gradient in step (c) comprises the resultant of the vectorial addition of first and second mutually orthogonal gradients which are coplanar with said planar slice, said first orthogonal gradient being amplitude-adjustable for phase encoding nuclear spin informaiton in the direction thereof.

53. The method of claim 52 wherein said imaging gradient is selected to have the same direction as said second orthogonal gradient.

54. The method of claim 53 wherein the integral of the waveform of said second orthogonal gradient with respect to time is selected to be equal to the integral of the waveform of said rephasing gradient in step (f) with respect to time over a time interval equal to said time period $\tau_a$.

55. The method of claim 52 wherein said imaging gradient in step (e) is selected to have a constant amplitude during the step of sampling said NMR spin echo signal.

56. The method of claim 55 further comprising the step of repeating the sequence of steps (a–g) for a different amplitude of said first orthogonal gradient.

57. A method for overcoming the effects of a spurious FID NMR signals produced by imperfect 180° RF pulses so as to avoid interference between the FID signal and the desired NMR spin echo signal, said method comprising the steps of:

a. maintaining a static magnetic field along a first axis of an NMR imaging sample;

b. irradiating said sample with a first RF pulse during a first predetermined time interval, so as to excite a first plurality of nuclear spins in said sample;

c. irradiating said imaging sample during a second time interval with a 180° RF pulse, whereupon inherent imperfections in said 180° RF pulse cause a second plurality of nuclear spins in said imaging sample to change orientation by an angle other than 180° relative to the direction of said static magnetic field, said last-mentioned nuclear spins producing a spurious FID NMR signal upon termination of said 180° RF pulse;

d. sampling an NMR signal composed of a first component produced by said first plurality of spins and a second component produced by said second plurality of nuclear spins in a third predetermined time interval subsequent to the application of said 180° RF pulse; and e. repeating steps (a–d) while shifting the phase of alternate ones of said first RF pulses so as to produce a 180° shift in the corresponding NMR signal produced by said first plurality of nuclear spins, such that when alternate ones of said sampled NMR signals are subtracted said spurious FID signals cancel.

58. The method of claim 57 wherein said first RF pulse comprises a selective 90° RF pulse is applied in the presence of a first magnetic field gradient pulse.

59. The method of claim 58 wherein said frequency selective pulse comprises a carrier modulated by a signal defined by (sin bt)/bt, wherein b is a constant and t is time.

60. The method of claim 58 wherein said 90° RF pulse comprises a Gaussian amplitude modulated carrier.

61. A method for overcoming the effects of a spurious FID NMR signals produced by imperfect 180° RF pulses so as to avoid interference between the FID signal and the desired NMR spin echo signal, said method comprising sequentially the steps of:

a. maintaining a static magnetic field along a first axis of an NMR imaging sample;

b. irradiating said sample with a first RF pulse during a first predetermined time interval, so as to excite a first pluraltiy of nuclear spins in said sample;

c. irradiating said imaging sample during a second time interval with a 180° RF pulse, whereupon inherent imperfections in said 180° RF pulse cause a second plurality of nuclear spins in said imaging sample to change orientation by an angle other than 180° relative to the direction of said static magnetic field, said last-mentioned nuclear spins producing a spurious FID NMR signal upon termination of said 180° RF pulse;

d. sampling an NMR signal composed of a first component produced by said first plurality of spins and a second component produced by said second plurality of nuclear spins in a third predetermined time interval subsequent to the application of said 180° RF pulse; and e. repeating steps (a–d) while shifting the phase of alternate ones of said 180° RF pulses so as to produce a 180° phase shift in the said FID NMR signal produced by said second plurality of nuclear spins, such that when said samples NMR signals are added, said spurious FID signals cancel.

62. The method of claim 61 wherein said first RF pulse comprises a selective 90° RF pulse is applied in the presence of a first magnetic field gradient pulse.

63. The method of claim 62 wherein said frequency selective pulse comprises a carrier modulated by a signal defined by (sin bt)/bt, wherein b is a constant and t is time.

64. The method of claim 62 wherein said 90° RF pulse comprises a Gaussian amplitude modulated carrier.

65. The method of claim 57 or 61 wherein said 180° RF pulse comprises a selective 180° RF Pulse.

* * * * *

UNITED STATES PATENT AND TRADEMARK OFFICE
CERTIFICATE OF CORRECTION

PATENT NO. : 4,443,760
DATED : April 17, 1984
INVENTOR(S) : William Alan Edelstein and Paul Arthur Bottomley It is certified that error appears in the above-identified patent and that said Letters Patent is hereby corrected as shown below:

Add to the list of references cited on the cover sheet the following:

4,184,110  1/1980   Hinshaw  .......... 324/313
4,307,344  12/1981  Walters  .......... 324/309
3,781,650  12/1973  Keller   .......... 324/0.5A Signed and Sealed this Sixteenth Day of October 1984

[SEAL]

Attest:

Attesting Officer

GERALD J. MOSSINGHOFF

Commissioner of Patents and Trademarks